United States Patent [19]

Kawaguchi et al.

[11] Patent Number: 4,485,000
[45] Date of Patent: Nov. 27, 1984

[54] SPUTTERING TARGET SUPPORTING DEVICE

[75] Inventors: Tatsuzo Kawaguchi, Yokohama; Mitsutoshi Koyama, Koganei, both of Japan

[73] Assignee: Kabushiki Kaisha Toshiba, Kawasaki, Japan

[21] Appl. No.: 603,683

[22] Filed: Apr. 25, 1984

[30] Foreign Application Priority Data

Apr. 28, 1983 [JP] Japan .................................. 58-75098

[51] Int. Cl.³ .............................................. C23C 15/00
[52] U.S. Cl. ................................ 204/298; 204/192 R
[58] Field of Search ............................ 204/298, 192 R

[56] References Cited
FOREIGN PATENT DOCUMENTS 57-73179  5/1982  Japan ............................. 204/192 R

OTHER PUBLICATIONS

Gambino et al., IBM Technical Disc. Bull., 22, (1979), pp. 1228–1229.
Lue, Vacuum, 32, (1982), pp. 363–365.
Vossen et al., Thin Film Processes; Academic Press, N.Y., N.Y., 1978, pp. 41–42.

Primary Examiner—Arthur P. Demers
Attorney, Agent, or Firm—Schwartz, Jeffery, Schwaab, Mack, Blumenthal & Koch

[57] ABSTRACT

In a sputtering target supporting device for fixing, to a common electrode, a plurality of beams forming a mosaic target used for co-sputtering, at least one pressing mechanism is provided exclusively for each of the beams to press the respective beam against the common electrode by means of the respective pressing mechanism provided therefor.

5 Claims, 9 Drawing Figures

SPUTTERING TARGET SUPPORTING DEVICE

BACKGROUND OF THE INVENTION

The present invention relates to a sputtering target supporting device, and particularly to a device for securing, to a common electrode, a plurality of beams forming a mosaic target used for co-sputtering two or more kinds of metal to form a thin film.

For instance, in a co-sputtering to form a thin film of alloy $MoSi_2$ of molybdenum Mo and silicon Si, a mosaic target comprising, in combination, molybdenum beams 1 and silicon beams 2 as shown in FIG. 1 is used. Beams 1 and 2 are fixed to an electrode 5, which also serves as a radiator or cooling plate, by having an inner holder 3 and an annular outer holder 4, shown in FIG. 2, secured to the electrode 5 by means of screws 3a and 4a, as shown in FIGS. 3 and 4.

The above-described fixing method has a disadvantage in that contact pressure between the beam and the electrode is not sufficient with respect to some of the beams because of an error in the dimensions of the beams and the holders. When the contact pressure is insufficient, the contact resistance is increased. Moreover, the electrode 5 also serves as a cooling plate as described above, so that the decreased contact pressure makes the cooling of the beam insufficient. For this reason, the temperature of the beam increases, and an electric power used for the discharge becomes insufficient. As a result, sputtering yield is decreased. The sputtering yield of some of the beams may be so much decreased that it is smaller than the rate of re-deposition of the ionized sputter atoms. Consequently, the composition of the thin film formed by sputtering varies.

SUMMARY OF THE INVENTION

An object of the invention is to provide a sputtering target supporting device which is capable of preventing decrease of sputtering yield of each beam, and of maintaining constant the compositon of the thin film formed by co-sputtering.

According to the invention, there is provided a sputtering target supporting device for fixing, to a common electrode, a plurality of beams forming a mosaic target used for co-sputtering, wherein at least one pressing mechanism is provided exclusively for each of the beams to press the respective beam against the common electrode by means of said at least one pressing mechanism provided therefor.

DETAILED DESCRIPTION OF THE PREFERRED EMBODIMENTS

Figure 1:
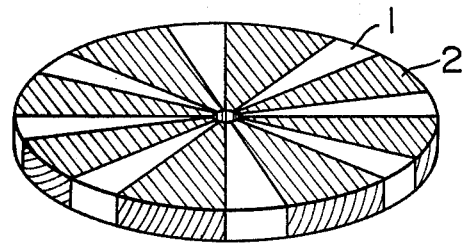
FIG. 1 is a perspective view showing a generally disk-shaped mosaic target formed by combining wedge-shaped beams.
Figure 2:
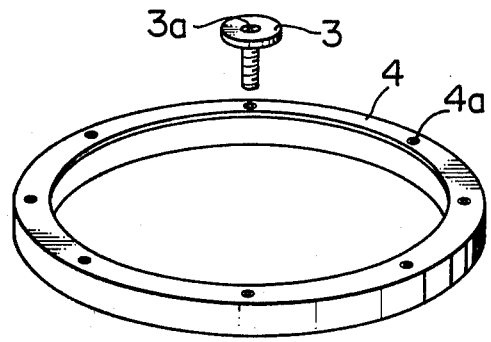
FIG. 2 is a perspective view showing holders 3 and 4 of a conventional supporting device.
Figure 3:
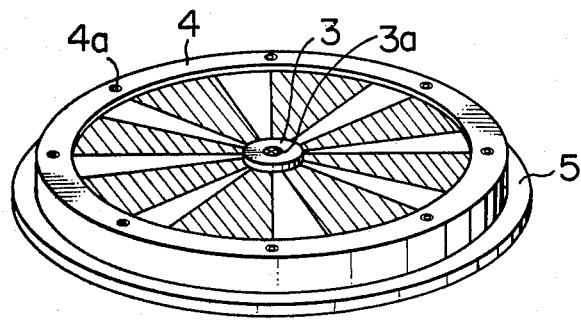
FIG. 3 is a perspective view showing a mosaic target fixed to an electrode by the conventional supporting device.
Figure 4:
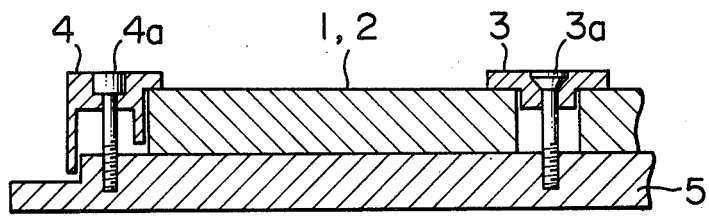
FIG. 4 is a enlarged sectional veiw of FIG. 3.
Figure 5:
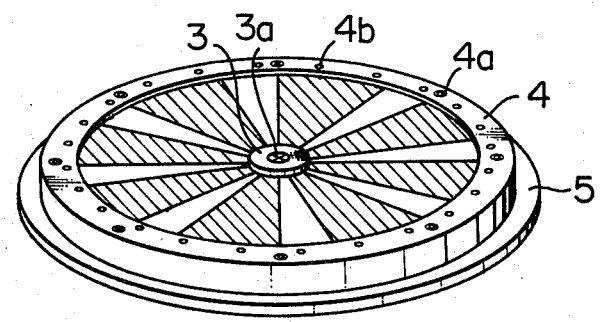
FIG. 5 is a perspective view showing a mosaic target fixed to an electrode by a supporting device of an embodiment of the invention.
Figure 6:
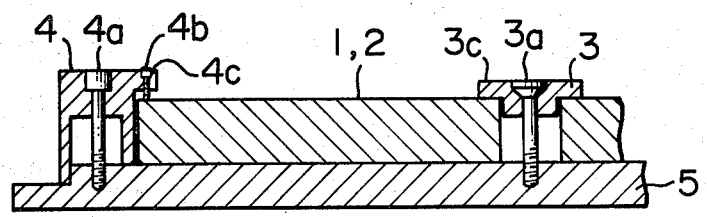
FIG. 6 is an enlarged sectional view of FIG. 5.

FIGS. 5 and 6 show a supporting device of an embodiment of the invention. This supporting device is, as is the supporting device of FIG. 1, for securing molybdenum beams 1 and silicon beams 2, which are wedge-shaped and so arranged that they, as a whole, form an annulus, and mounted or placed on a substantially disk-shaped electrode 5. The beams are held or retained, at their inner or narrower ends, by an inner holder 3. And, at their outer or wider ends, by an outer holder 4. The outer holder 4 extends along the outer periphery of the disk-shaped electrode, and fixed to the outer peripheral portion by means of screws 4a, and is used to press, in a manner described later, the wider end of each of the wedge-shaped beams against the outer peripheral portion of the electrode 5. The inner holder 3 is positioned at the center of the disk-shaped electrode 5, and is fixed to the central portion of the electrode 5 by means of a screw 3a, to press, by an overhang 3c extending toward the outer periphery of the electrode 5, the narrower end of each of the wedge-shaped beams against the central portion of the electrode.

The outer holder 4 has an overhang 4c extending toward the central portion of the electrode 5, and the wider ends of the beams 1 and 2 are inserted between the overhang 4c and the electrode 5.

A plurality of screws 4b are threaded in the overhang 4c of the outer holder 4. As shown in FIG. 5, at least one such screw 4b is provided for each beam. In the illustrated example, one screw 4b is provided for each of relatively narrow molybdenum beam, whereas two screws 4b are provided for each of relatively wide silicon beams. Ends of the screws 4b are, as shown in FIG. 6, in abutment with the upper surfaces of the beams and press the respective beams down, i.e., against the electrode 5.

Figure 7:
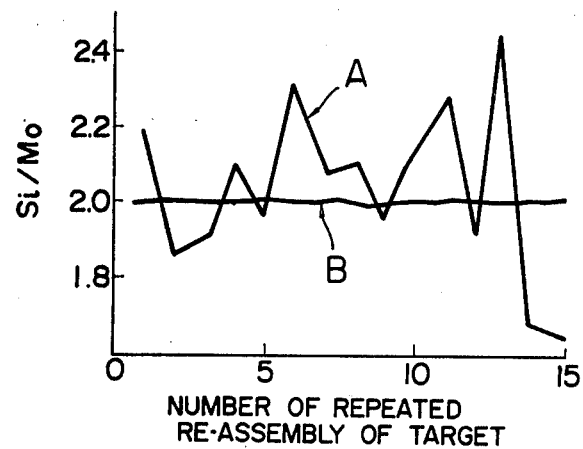
FIG. 7 is a graph showing the result of comparison of performance of a conventional device and a device according to the invention.

Thus, at least one screw 4b is provided exclusively for each beam, and serves to press each beam individually against the electrode 5, so that the contact pressure between the beam and the electrode is sufficient with respect to each of the beams. The problem of the prior art that the contact pressure is insufficient with respect to some of the beams, due to difference in the thickness of the beams, etc., is eliminated. As a result, it is ensured that the composition of the resultant film does not vary as far as the area ratio (ratio of the total area of the exposed surfaces of the silicon beams to the total area of the exposed surfaces of the molybdenum beams) is unchanged. This is shown in FIG. 7. With the conventional supporting device, the ratio Si/Mo of the composition varies substantially, as shown by a curve A, every time the target is re-assembled. With the supporting device according to the invention, the ratio is maintained (at 2.0, for example) as shown by a curve B.

Figure 8:
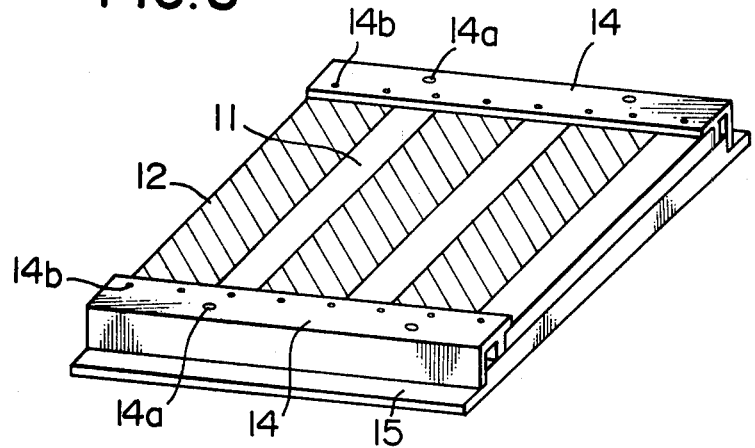
FIG. 8 is a perspective view showing a mosaic target of a different shape, by a supporting device of another embodiment of the invention.
Figure 9:
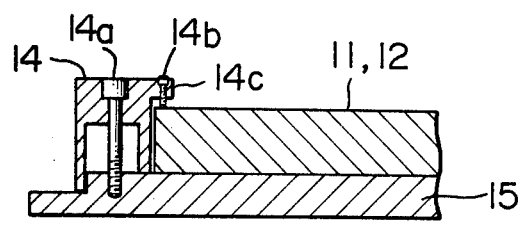
FIG. 9 is an enlarged sectional view of FIG. 8.

In the embodiment described above, the mosaic target is an assembly of wedge-shaped beams 1 and 2 and is generally annular or disk-shaped. The invention is not limited to such specific shape of the mosaic target, and is applicable to a situation where, as shown in FIGS. 8 and 9, strip-shaped beams are placed side by side and their both ends are fixed by means of a pair of holders 14. In addition to screws 14a for tightening the holders 14 to a rectangular electrode 15, at least one screw 14b is provided for each end of each beam. Each screw 14b is threaded in a overhang 14c of the holder 14 and abuts, at its end, an end of the beam, to press the beam against the electrode 15. In this case, too, a larger member (two, in the illustrated example) of screws 14b may be provided for relatively wide beams.

In the embodiments described, screws 4b or 14b are used as mechanism for pressing. But it will be understood that any other device having the same function can be used as an alternative. An example is a spring mounted to the holder and adopted to press each beam against the electrode.

It will be appreciated that when the supporting device according to the invention is used, sufficient electric power can be supplied for use for the discharge, and sufficient cooling is achieved. It is therefore possible to prevent the decrease in the sputtering yield. It is also possible to avoid variation of the composition of the film due to reassembly of the mosaic target.

What is claimed is:

1. A sputtering target supporting device for fixing, to a common electrode, a plurality of beams forming a mosaic target used for co-sputtering, wherein at least one pressing mechanism is provided exclusively for each of the beams to press the respective beam against the common electrode by means of said at least one pressing mechanism provided therefor.

2. A device according to claim 1, further comprising a holder fixed to said electrode, wherein each of the pressing mechanisms comprises means mounted to the holder and pressing the beam against the electrode.

3. A device according to claim 2, wherein said holder has an overhang, an end of each beam is inserted between the overhang and the electrode, and each of said pressing mechanisms comprises a screw threaded in said overhang and having its end in abutment with the respective beam.

4. A device according to claim 2, wherein each of the beams is substantially wedge-shaped, the electrode is substantially disk-shaped, the holder extends along the outer periphery of the disk-shaped electrode, and fixed to the outer peripheral portion of the electrode, and the pressing mechanisms are mounted to the holder and press the wider ends of the respective beams.

5. A device according to claim 4, further comprising an additional holder which is positioned in the central portion of the disk-shaped electrode, and fixed to the central portion, and has an overhang for pressing the narrower ends of the respective beams.

* * * * *